United States Patent [19]
Iwamuro

[11] Patent Number: 5,326,993
[45] Date of Patent: Jul. 5, 1994

[54] INSULATED GATE BIPOLAR TRANSISTOR
[75] Inventor: Noriyuki Iwamuro, Kanagawa, Japan
[73] Assignee: Fuji Electric Co., Ltd., Kanagawa, Japan
[21] Appl. No.: 870,324
[22] Filed: Apr. 17, 1992
[30] Foreign Application Priority Data
Apr. 23, 1991 [JP] Japan .................... 3-091846
[51] Int. Cl.$^5$ ................ H01L 29/740; H01L 29/747
[52] U.S. Cl. ..................... 257/139; 257/140; 257/142
[58] Field of Search ............... 257/142, 139, 140

[56] References Cited
FOREIGN PATENT DOCUMENTS
0417738 3/1991 European Pat. Off. ........... 257/139

Primary Examiner—Rolf Hille
Assistant Examiner—David B. Hardy
Attorney, Agent, or Firm—Finnegan, Henderson, Farabow, Garrett & Dunner

[57] ABSTRACT

An insulated gate bipolar transistor employs a semiconductor substrate constructed by putting a high impurity density area, a low impurity density and a conductivity modulation area, respectively, of an n type on one another sequentially on a substrate of a p type, serving as a drain area. A gate is disposed on a gate oxide film deposited on the conductivity modulation area. A channel forming layer of a p type and a source layer of an n type are diffused from windows of the gate in such a manner that the peripheral edges of these layers creep under the gate, and a drain terminal, a source terminal, and on/off controlling gate terminal extend from the drain area, the channel forming layer and source layer, and the gate, respectively.

5 Claims, 2 Drawing Sheets

PRIOR ART

INSULATED GATE BIPOLAR TRANSISTOR

BACKGROUND OF THE INVENTION

Field of the Invention

The present invention relates to a bipolar transistor; and more particularly to an insulated gate bipolar transistor (IGBT) suitable for switching high electric power.

Description of the Related Art

As is well known, an IGBT has an insulated gate which controls the operation of a bipolar transistor. The IGBT is characterized in that it has a higher input impedance than a bipolar transistor and has a lower resistance when turned on than a field effect transistor. As a result of these characteristics, the IGBT has been widely recognized as a separate device which is advantageous for use in switching large electric power; and thus, is employed in various industrial uses. Although they are quite well known, a known description will be given of a typical exemplary structure of a conventional IGBT with reference to FIG. 4.

In FIG. 4, there is shown a structural unit of an IGBT including a gate as a central part thereof. Actually, the IGBT is constructed as a composite structure in which the illustrated structural units are repeatedly combined with one another one-dimensionally or two-dimensionally. A semiconductor substrate 10, which is a chip or a wafer for an IGBT, is constructed in such a manner that a thin, high impurity density area 2 of an n type, and a thick, conductivity modulation area 4 are sequentially put on each other on a p type substrate drain area 1 of the semiconductor substrate 10, by epitaxial growth method, or other similar method.

A gate 20 of a polycrystalline silicone, or the like, is disposed on a very thin insulation film 21, such as a gate oxide film, or the like, and in turn onto the surface of the conductivity modulation area 4 of the semiconductor substrate 10, in such a pattern that gate 20 includes a window. In the respective windows, there is diffused a p type channel forming layer 30 with gate 20 as a mask thereof in such a manner that the channel forming layer 30 creeps under or, in other words, extends under the edges of gate 20. In the channel forming layer 30, there is diffused an n type source layer 40 having a high impurity density with the gate 20 as a part of a mask thereof, in such a manner that the peripheral edges of the source layer 40 creep or extend slightly under the gate 20. Generally, a high density part 31 is diffused in the central portion of the channel forming layer 30.

Next, the gate 20 is covered with an insulation film 51 of phosphate silicate glass or the like. Then there is attached a conductive electrode film 52 by means of a metal such as aluminum or the like on the surface of the semiconductor substrate 10, which contacts the channel forming layer 30 in the windows of the insulation film 51. Also, on the back surface of the semiconductor substrate 10, there is attached a similar conductive electrode film 53, in contact with the drain area 1. As shown in FIG. 4, a source terminal S extends from the electrode film 52 and a drain terminal D extends from the electrode film 53. Further, a gate terminal G of the gate 20 is extends from a portion other than the section shown in FIG. 4.

IGBT having the structure shown in FIG. 4 is used in such a manner that a positive circuit voltage is applied to the drain terminal D and, when the IGBT is off, the circuit voltage is carried by a depletion layer extending from the p/n junction between the channel forming layer 30 and conductivity modulation area 4 mainly into the conductivity modulation area 4. If a control voltage is connected across the source terminal S and the gate terminal G, with the positive voltage applied to source terminal S, then an n channel Cn is allowed to conduct on the surface of the p-type channel forming layer 30, located below the gate 20, so that electrons are charged from the source layer 40 into the conductivity modulation area 4. As a result, the conductivity of the n-type conductivity modulation area 4 is increased rapidly due to a conductivity modulation action caused by the thus charged carriers, thereby turning on an npn transistor having the conductivity modulation area 4 as an n-type base, channel forming layer 30 as a p-type emitter, and drain area 1 as a p-type collector, so that an area existing between the drain terminal D and source terminal S is allowed to conduct in the "on" condition with a low on-voltage. If the voltage applied to the gate terminal G is cut off, then the charging of the carriers into the conductivity modulation area 4 is also stopped to cut off the base current of the above-mentioned npn transistor, and thus turn it off, so that the IGBT is returned to its original off-state.

The above-mentioned IGBT can be turned on and off by a voltage applied to the gate 20 so that it has a much higher input impedance than a bipolar transistor. Also, when it is conducting, the IGBT has an on-voltage of several volts which are almost the same as the bipolar transistor. This means that the on-voltage of the IGBT is much lower when compared with a field effect transistor. However, the IGBT requires a relatively longer time to turn off. When it is made to withstand much higher voltages, the turn-off time of the IGBT is much longer, and also the on-voltage thereof readily increases.

In other words, when the IGBT is made to withstand much higher voltages, it is necessary to increase the thickness of the conductivity modulation area 4 into which the depletion layer extends when the IGBT is off. More particularly, when turning off the IGBT, it takes considerable time for the depletion layer to spread out into the conductivity modulation area 4, thereby requiring a longer turn-off time. Further, even when the IGBT is on, the on-voltage thereof is increased. Conventionally, there is known a technique, which employs an atom such as gold or the like, or a crystalline defect by means of electron illumination, in order to facilitate the re-combination of carriers in the turn-off operation. However, such life-time killing technique causes the carriers in the conductivity modulation area 4 to be re-combined together even in the on-state and thereby weaken the conductivity modulation action of the area 4, with the result that the conductivity of the area 4 is decreased and thus the on-voltage increases readily.

SUMMARY OF THE INVENTION

In view of the above circumstances, the present invention aims at eliminating the drawbacks found in the above-mentioned conventional IGBT. Accordingly, it is an object of the invention to provide an IGBT, the withstand voltage of which can be enhanced without adversely affecting the switching speed and the on-voltage thereof.

Additional objects and advantages of the invention will be set forth in part in the description which follows, and in part will be obvious from the description, or may learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises an IGBT in which there is used a semiconductor substrate having a drain area of one conductivity type, a high impurity density area, a low impurity density area and a conductivity modulation area, respectively, of the other conductive type, sequentially disposed overlaying one another; a gate is disposed through an insulation film on the surface of the conductivity modulation area, a channel forming layer of one conductivity type and a source layer of another conductivity type are respectively diffused from the surface of the conductivity modulation area such that the edge portions thereof extend under the edges of the gate; and, a drain terminal extends from the drain area, a source terminal extends from the channel forming layer and source layer, and a gate terminal extends from the gate, respectively.

The impurity density of the low impurity density area may be reduced to one-half or less, preferably, one-tenth or less than the impurity density of the conductivity modulation area. The thickness of the low impurity density area may be set to be 20~50%, preferably, 25~35% of the sum of the thicknesses of the low impurity density area and conductivity modulation area, and the smallest thickness of the low impurity density area may be 5 μm.

According to the present invention, by reliance on the fact that an internal electric field intensity can be increased by reducing the impurity density of the semiconductor area, by replacing a portion of the conductivity modulation area with the low impurity density area mentioned above herein, the withstand voltage of the IGBT can be enhanced with the same thickness as that of the conductivity modulation area of the prior art and, at the same time, the on-voltage thereof can be reduced when compared with a situation where the thickness of the conductivity modulation area is increased in order to provide a higher withstand voltage. Also, it is well known that, when the IGBT is turned off, a depletion layer extends from the pn junction surface between the channel forming layer and conductivity modulation area. According to the invention, by utilizing the property that the depletion layer is easy to extend in the low impurity density area but the extension of the depletion layer is caused to stop in the high impurity density area, the depletion layer is rapidly extended from the conductivity modulation area through the low impurity density area to the high impurity density area to thereby shorten the spreading time of the depletion layer, that is, a time during which a current flows to the IGBT in the turning-off operation, so as to reduce the IGBT turn-off time or turn-off loss.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DETAILED DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1:
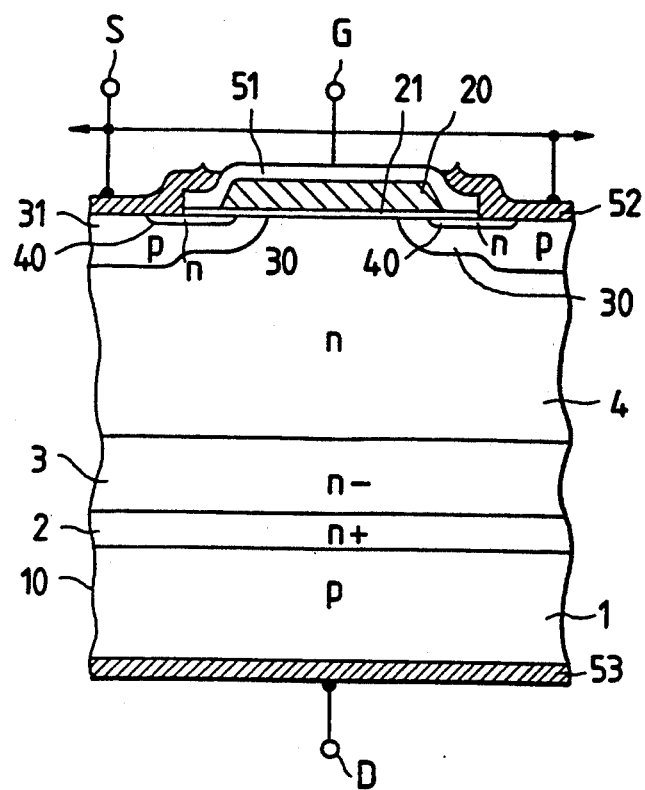
FIG. 1 is a sectional view of a unit structure of an embodiment of an IGBT according to the present invention.
Figure 2:
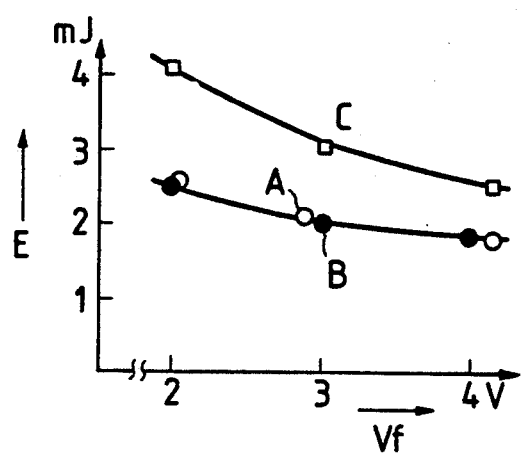
FIG. 2 is a graphical representation of the characteristic of an IGBT according to an embodiment of the invention shown in FIG. 1 when compared with a conventional IGBT, showing the switching loss of the present IGBT with respect to the on voltage thereof.

In FIG. 1, there is shown a sectional view of a unit structure of an IGBT according to the present invention. In FIG. 2, there is shown a graphical representation of the turn-off loss of the IGBT and, in FIG. 3, there is shown a graphical representation of the withstand voltage of the IGBT.

The IGBT, as embodied in FIG. 1 includes a semiconductor substrate 10 which can be constructed by doping the substrate with an impurity of a p type having an impurity density of the order of $10^{19}$ atoms/cm$^3$, the region serving as a drain area 1 of the semiconductor substrate 10. A high impurity density area 2 of an n type having an impurity density of the order of $10^{18}$ atoms/cm$^3$ with a thickness of 5 μm, a low impurity density area 3 of an n type having an impurity density of the order of $2 \times 10^{13}$ atoms/cm$^3$ with a thickness of 20 μm, and a conductivity modulation area 4 of an n type having an impurity density of the order of $2 \times 10$ atoms/cm$^3$ with a thickness of 50 μm are sequentially formed on one another by epitaxial growth. It should be noted here that the thicknesses of the low impurity density area 3 and conductivity modulation area 4 correspond to a working circuit voltage of the order of 600 V.

The remaining construction of the present embodiment is similar to that of the conventional IGBT. In other words, an insulation film 21, such as a gate oxide film or the like, with a thickness in the order of 0.1 μm, is deposited on the surface of semiconductor substrate 10 adjacent the conductivity modulation area 4. A gate 20, such as polycrystalline silicone with a thickness in the order of 0.5 μm is disposed on the insulation film 21 in a pattern that includes windows. A channel forming layer 30 of a p type having an impurity density in the order of $2 \times 10^{17}$ atoms/cm$^3$ is diffused, for example, to a depth of 5 μm in each of the windows. The gate 20 serves as a mask in such a manner that the peripheral edges of the channel forming region 30 creep under the gate 20. A source region 40 of an n type having a high impurity density in the order of $10^{20}$ atoms/cm$^3$ or more is diffused, for example, to a depth of 0.5 μm or less, in the channel forming layer 30 with the gate 20 as a part of a mask in such a manner that the peripheral edges of the source layer 40 creep slightly under the gate 20. Also, may be diffused in the central portion of the channel forming region 30 at an impurity density of $10^{19}$ atoms/cm$^3$ or more.

Figure 4:
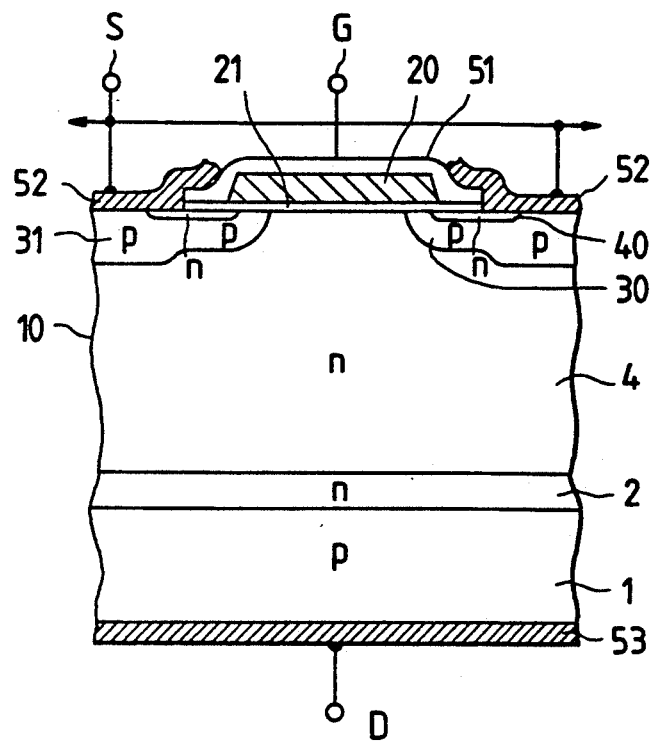

Further, similar to FIG. 4, the gate 20 is covered with an insulation film 51, an electrode film 52 is disposed on the surface side of the semiconductor substrate 10, and an electrode film 53 is disposed on the back surface thereof. A source terminal S, a drain terminal D and a gate terminal G extend therefrom, respectively.

The IGBT of the present invention, structured as above-mentioned is normally used in such a manner that a positive circuit voltage is applied to the drain terminal D thereof, similar to the conventional IGBT. In the turn-off operation of the present IGBT, a depletion layer extends from the pn junction surface between the channel forming layer 30 and conductivity modulation area 4 into the conductivity modulation area 4 and low impurity density area 3 up to the high impurity density area 2. However, because the impurity densities of the two areas are different by a power of one, the voltage load of the low impurity density area 3 for every 1 μm unit thickness is greater than that of the conductivity modulation area 4. Therefore, as in the present embodiment, by selecting the thickness of the low impurity density area 3 to be on the order of 30% of the sum of the thicknesses of the two areas 3 and 4, the withstand voltage of the IGBT is enhanced.

In the IGBT according to the invention as well, the on/off switching operation thereof is, of course, controlled by a voltage applied to the gate terminal G thereof. In the on state of the present IGBT, while a current flows through the low impurity density area 3 to thereby cause the on-voltage thereof to increase to some extent, the increase in the on voltage is only slight when the thickness of the low impurity density area 3 is one-half or less than the sum of the thicknesses of the low impurity density area 3 and conductivity modulation area 4. When the thickness of the area 3 is on the order of 30% of the sum as in the present embodiment, the on-voltage increase has little effect on the switching operation of the IGBT as discussed.

When the IGBT of the invention is turned off, the turn-off operation is facilitated by the low impurity density area 3. In a transient state, in which the IGBT is switched from on to off, even after a load current is cut off and the portion of the IGBT existing between the drain terminal D and source terminal S is clamped by a power supply voltage, a current continues to flow so long as the depletion layer spreads within the IGBT. As is well known, this is a main cause of the prolonged switching operation of the IGBT when it is turned off. When the leading end of the spreading depletion layer reaches the low impurity density area 3 from the conductivity modulation area 4, the depletion layer is very easy to extend to the low impurity density area 3. Thus, the depletion layer can move up to the high impurity density area 2 in a short time and then terminates its spreading operation at the high impurity density area. From the foregoing, it will be understood that the low impurity density area 3 is effective in that it can accelerate the spreading of the depletion layer to thereby decreases the turn-off time of the IGBT. However, since the low impurity density area 3 cannot facilitate the spreading of the depletion layer in the conductivity modulation area 4. It is preferred, in the present invention, to employ in the semiconductor substrate 10, a life time killer for the conductivity modulation area 4.

Now, FIG. 2 is a graphical representation which shows the turn-off time reducing effect of the low impurity density area 3 by means of a switching loss. In FIG. 2, the ordinate represents the switching losses E of the IGBT in an mJ unit, and the abscissa represents the on-voltage Vf of the IGBT. Small circles shown by A in FIG. 2 respectively designate samples of an IGBT which includes the low impurity density area 3 having a thickness of 20 μm and the conductivity modulation area 4 having a thickness of 50 μm respectively constructed according to the embodiment of the invention of FIG. 1. A sample for the IGBT having an on-voltage of 2V is constructed with no life time killer included, while samples for the IGBT respectively having an on-voltage of 3V and 4V are constructed in such a manner that life time killers are guided therein at proper densities by means of electron illumination.

Also, comparison samples B respectively designated by black circles are samples of a conventional IGBT which does not include the low impurity density area 3 but includes a conductivity modulation area 4 having an impurity density of $2 \times 10^{14}$ atoms/cm$^3$ and a thickness of 70 μm. Similar to the above-mentioned embodiment of the present invention, one sample is constructed without any life time killer, while the other two samples are constructed with a life time killer included. Further, comparison samples C respectively shown by a square are identical in structure with the comparison samples B, while each of the comparison samples C includes the conductivity modulation area 4 which has an impurity density of $2 \times 10^{13}$ atoms/cm$^3$ equal to that of the low impurity density area 3 of the embodiment shown in FIG. 1. In FIG. 2, the value of the switching loss E and on-voltage Vf are values obtained when the current density of the IGBT is 100 A/cm$^2$.

As shown in FIG. 2, the switching loss E of the sample A, in which about 30% of thickness of the conductivity modulation area 4 is replaced with the low impurity density area 3, is almost equal to that of the sample B of the conventional IGBT in which the conductivity modulation area 4 is not replaced, while the switching loss E of the sample C, in which the whole conductivity modulation area 4 is replaced with the low impurity density area 3, is increased to a fairly great extent. This shows that only part of the conductivity modulation area 4 can be advantageously replaced with the low impurity density area 3.

Figure 3:
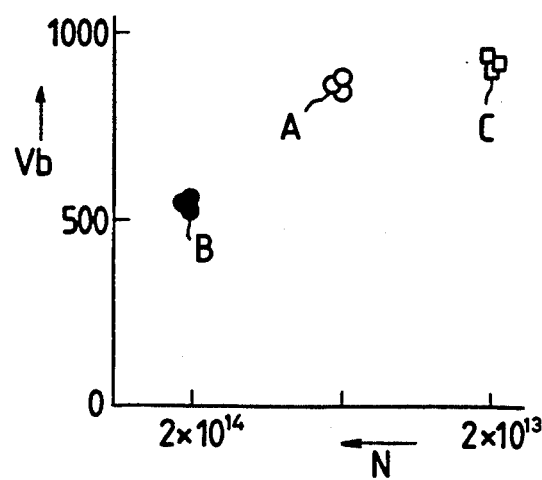
FIG. 3 is a graphical representation of the withstand voltage of the IGBT according to the embodiment shown in FIG. 1 when compared with the conventional IGBT; and, FIG. 4 is a sectional view of a unit structure of an IGBT according to the prior art.

Referring now to FIG. 3, there is shown a graphical representation in which the respective three samples of the three kinds of samples A~C respectively having an on-voltage of the order of 3V are compared with one another with respect to the withstand voltage Vb thereof. The withstand voltage Vb of the sample A of the IGBT according to the invention is 800~900 V. This is almost equal to that of the sample C of the conventional IGBT with the conductivity modulation area 4 having an impurity density N of $2 \times 10^{13}$ atoms/cm$^3$ and is greater than 300 V than that of the sample B of the conventional IGBT with the conductivity modulation area 4 having an impurity density of $2 \times 10^{14}$ atoms/cm$^3$.

As can be understood from FIGS. 2 and 3, according to the conventional IGBT, there arises a so called trade-off relationship in which, if the impurity density of the conductivity modulation area 4 is reduced so as to increase the withstand voltage thereof, then the switching loss E or on-voltage Vf thereof is increased. Even when the thickness of the conductivity modulation area 4 is increased, the trade-off relationship is similarly provided. In contrast to this, according to the IGBT of the present invention, such trade-off problem can be solved and the withstand voltage Vf of the IGBT can be increased without increasing the switching loss E or on-voltage Vf of the IGBT.

In order to provide the above-mentioned result, it is advantageous that the impurity density of the low impurity density area 3 is one half or less than that of the conductivity modulation area 4, and it is desirable that the impurity densities of the two areas are different from each other about one power as in the embodiment shown in FIG. 1. Also, for the purpose of increasing the withstand voltage of the IGBT, in general, it is advantageous that a high ratio is selected as the ratio of the thickness of the low impurity density area 3 with respect to the sum of the thicknesses of the low impurity density area 3 and conductivity modulation area 4. However, if too high a ratio is selected, as can be understood from FIG. 2, the switching loss of the IGBT is then increased, and the on-voltage thereof is also adversely affected. For this reason, although it also depends on the impurity density of the low impurity density area 3, the ratio may be 20~50% and, normally, it is best to select the ratio in a range of 25~35%. Further, while the thickness of the low impurity density area 3 can vary according to the value of the withstand voltage to be given to the IGBT, too small a thickness has no effect and, therefore, the smallest thickness of the low impurity density area 3 may be of the order of 5 $\mu$m. In this manner, the present invention is not limited to the above-mentioned embodiment, but it can be modified in various kinds of embodiments without departing from the spirit and scope of the invention.

As has been described heretofore, the present invention can provide the following effects by replacing in part the conductivity modulation area of the convention IGBT with the low impurity density area.

By increasing the field strength of the low impurity density area beyond that of the conductivity modulation area, the withstand voltage of the IGBT can be enhanced with the same thickness as the conductivity modulation area of the conventional IGBT.

By accelerating the spreading of the depletion layer due to the low impurity density area to thereby extend rapidly the depletion area up to the high impurity density area, the turn-off time or loss of the IGBT can be reduced.

The invention is able to solve the trade-off problem that arises due to a relationship between the impurity density and thickness of the conductivity modulation area and the switching loss and on-voltage of the IGBT and is left unsolved in the conventional IGBT and, therefore, it is also able to give a higher withstand voltage to the IGBT without adversely affecting the switching speed and the on-voltage thereof.

The above-mentioned effects of the invention are advantageous when a withstand voltage of several hundred volts is required. The application of the invention facilitates the use of IGBTs with a higher voltage and, thus the invention contributes to an increased range of applications and uses of the IGBTs.

What I claim is:

1. An IGBT, comprising:
   a semi-conductor substrate having first and second opposite surfaces; said substrate including:
   a drain area of one conductivity type adjacent the first opposite surface;
   a high impurity density area of another conductivity type disposed on the drain area of the semiconductor substrate;
   a low impurity density area having an impurity density lower than the high impurity density area of the other conductivity type disposed on the high impurity density area;
   a conductivity modulation area of the other conductivity type having a selected impurity density and thickness disposed between the second opposite surface and the low impurity density area, the low impurity density area having a thickness in a range of 20~50% of the sum of the thickness of said low impurity density area and the thickness of said conductivity modulation;
   an insulation film disposed on the conductivity modulation area;
   a gate disposed on said insulation film overlying the conductivity modulation area;
   the semiconductor substrate including a channel forming layer of the one conductivity type disposed in the conductivity modulation area adjacent the second opposite surface with edge portions extending beneath an edge of the gate;
   a source layer of said other conductivity type diffused in the channel forming layer extending beneath the channel forming layer defining a window beneath a central portion of the gate;
   a drain terminal connected to and extending from the drain area;
   a source terminal connected to and extending from the source layer; and
   a gate terminal connected to and extending from the gate.

2. The insulated gate bipolar transistor of claim 1, said low density impurity area contains impurities having a density per cubic centimeter no greater than approximately one half of the selected impurity density per cubic centimeter of said conductivity modulation area.

3. The insulated gate bipolar transistor of claim 1, wherein said low impurity density area has a thickness in a range of 25~35% of the sum of the thickness of said low impurity density area and the thickness of said conductivity modulation area.

4. The insulated gate bipolar transistor of claim 3, wherein said low impurity density area has a thickness of at least 5 $\mu$m.

5. The insulated gate bipolar transistor of claim 1, wherein said low impurity density area has a thickness of at least 5 $\mu$m.

* * * * *